(12) United States Patent
Gortzen et al.

(10) Patent No.: US 8,651,542 B2
(45) Date of Patent: Feb. 18, 2014

(54) PLACEMENT DEVICE FOR ASSEMBLING COMPONENTS IN ELECTRONIC DEVICES

(75) Inventors: Roger Gortzen, Eindhoven (NL); Ronald Plak, Waarland (NL); Jorg Balder Van Schijndel, Nuenen (NL)

(73) Assignee: Nederlandse Organisatie Voor Toegepast-Natuurwetenschappelijk Onderzoek TNO, Delft (NL)

( * ) Notice: Subject to any disclaimer, the term of this patent is extended or adjusted under 35 U.S.C. 154(b) by 876 days.

(21) Appl. No.: 12/665,577

(22) PCT Filed: Jun. 19, 2008

(86) PCT No.: PCT/NL2008/050397
§ 371 (c)(1),
(2), (4) Date: Feb. 10, 2010

(87) PCT Pub. No.: WO2008/156359
PCT Pub. Date: Dec. 24, 2008

(65) Prior Publication Data
US 2010/0215462 A1    Aug. 26, 2010

(30) Foreign Application Priority Data
Jun. 19, 2007  (EP) .................................... 07110566

(51) Int. Cl.
*B25B 5/04*  (2006.01)
*B25J 15/06*  (2006.01)

(52) U.S. Cl.
USPC .......................................... 294/183; 294/86.4

(58) Field of Classification Search
USPC ........ 294/86.4, 196, 183, 189, 65; 414/752.1, 414/737, 744.3; 901/40
See application file for complete search history.

(56) References Cited

U.S. PATENT DOCUMENTS

| | | | |
|---|---|---|---|
| 4,600,228 A | 7/1986 | Tarbuck | |
| 4,671,553 A * | 6/1987 | Bertini | 294/196 |
| 5,029,383 A | 7/1991 | Snyder et al. | |
| 5,125,152 A | 6/1992 | Grasmueller et al. | |
| 5,255,948 A | 10/1993 | Wiercienski et al. | |
| 5,263,753 A * | 11/1993 | Breu et al. | 294/196 |
| 5,957,305 A | 9/1999 | Takahashi | |
| 2004/0069216 A1 | 4/2004 | Nagar et al. | |
| 2010/0332159 A1* | 12/2010 | Gortzen et al. | 29/729 |

FOREIGN PATENT DOCUMENTS

| | | |
|---|---|---|
| DE | 102 12 935 A1 | 10/2003 |
| JP | 01-135000 A | 5/1989 |
| JP | 09-246790 A | 9/1997 |
| JP | 2007-27408 A | 2/2007 |
| WO | WO 89/01732 A1 | 2/1989 |
| WO | WO 93/08113 A1 | 4/1993 |
| WO | WO 98/14041 A1 | 4/1998 |
| WO | WO 2005/048677 A1 | 5/2005 |

* cited by examiner

*Primary Examiner* — Paul T Chin
(74) *Attorney, Agent, or Firm* — Dorsey & Whitney, LLP

(57) ABSTRACT

A placement device comprises a vacuum gripper (110) and a holder (120). The gripper, formed as a vacuum needle, is movable relative to the holder along a first axis. The gripper and the holder are mutually coupled by a membrane (160) allowing the gripper to tilt away from the first axis.

12 Claims, 7 Drawing Sheets

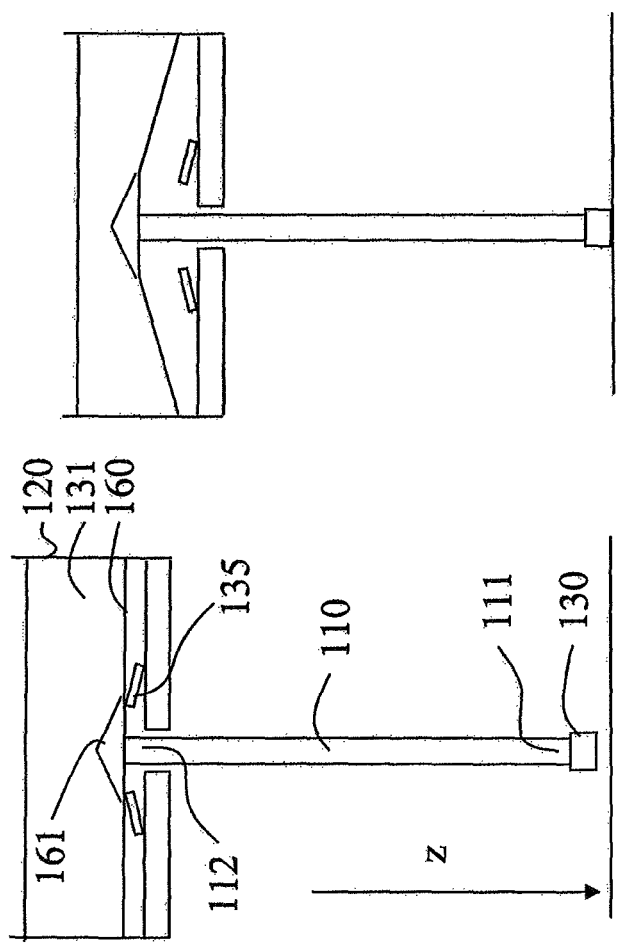

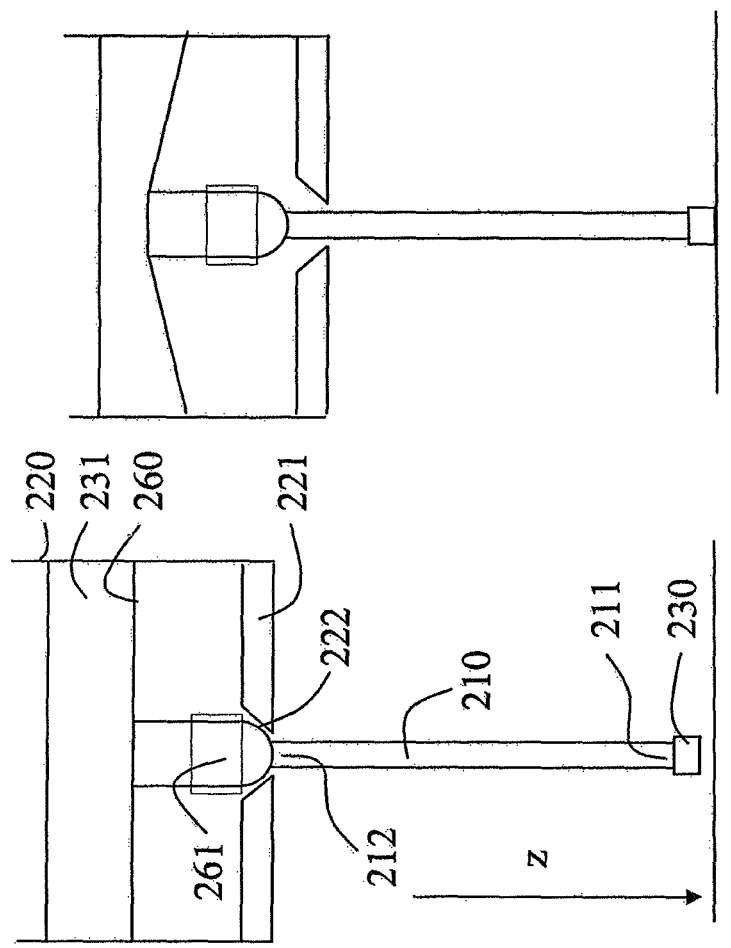

US 8,651,542 B2

PLACEMENT DEVICE FOR ASSEMBLING COMPONENTS IN ELECTRONIC DEVICES

CROSS-REFERENCE TO RELATED APPLICATIONS

This application is the national stage application of PCT Patent Application No. PCT/NL2008/050397, filed Jun. 19, 2008 and entitled "The Invention Relates to a Placement Device. The Invention Further Relates to an Assembly Device Comprising a Placement Device", and claims priority under 35 U.S.C. §365(b) to European Patent Application No. 07110566.2, filed Jun. 19, 2007 and entitled "Placement Device and Assembly Device".

FIELD OF THE INVENTION

The invention relates to a placement device.

The invention further relates to an assembly device comprising a placement device.

BACKGROUND

Placement devices are used for assembling components, e.g. components in hybrid microsystems, or for placing components on a substrate, e.g. a printed circuit board. Additionally placement devices may be used for other pick & place activities, such as taking components from a component supply belt and placing them on a location for further processing. In order to enable a fast manufacturing process, it is desired that the placement device places the components with a high speed. However, increasing the placement speed tends to increase the contact forces exerted by the gripper on the component or on the substrate. The current approach is to reduce these contact forces by moveably coupling the gripper to the other parts of placement device, wherein the gripper, that contacts the component, has a relatively low mass.

Such a placement device is described for example in U.S. 2005/0035613. The gripper described therein is mounted coaxially in a holder. A pretension is applied to the gripper by an electric or magnetic field. In this way the placing force is independent on the distance covered by the gripper relative to the holder when placing objects onto a substrate.

After the collision of the gripper and the component with the substrate, which causes the gripper to stop, the holder will in practice continue to move along a certain distance, e.g. some hundreds of μm before its movement stops. It has been recognized by the inventor that during this relative movement generally small lateral displacement occur in the guidance of the gripper. This may have various causes, e.g inaccuracies in the guidance system, a resilient suspension of the gripper in the holder that is not symmetrical, a deviation between the main axes of the guidance and the motion direction of the holder. These lateral displacements in the guidance of the gripper can lead to placement inaccuracies and/or stress build-up in the gripper.

SUMMARY OF THE INVENTION

It is a purpose of the present invention to provide a placement device and an assembly device wherein such inaccuracies are at least substantially avoided. It is a further purpose of the present invention to provide an assembly device comprising such a placement device.

In accordance with this purpose the present invention provides a placement device comprising a gripper and a holder, wherein the gripper is movable relative to the holder along a first axis (z). A tilting member allows the gripper to tilt away from the first axis. In this way there will be no significant lateral forces from the holder on the component. Therewith inaccuracies in the placement of the component and/or damages of the component caused by lateral forces are at least reduced.

An additional tilting member between gripper and component or between holder and the other parts of the placement device allows the component to align with the substrate.

In a preferred embodiment the gripper and the holder are mutually coupled by the tilting member. The mass of the gripper alone is in practice substantially smaller than that of the placement device in its entirety. Hence the gripper can more easily adapt its own tilt angle to compensate for the deviation in the direction of relative movement of the gripper and the holder. Accordingly, in this embodiment lateral forces and the consequences thereof are even more strongly reduced.

The tilting member may comprise any suitable parts that allow the gripper to tilt away from the first axis, e.g. a hinge, a flexible rod. The tilting member may allow for a tilt in a single angular direction or in a range of angular directions. The magnitude of the tilt may be limited within a predetermined range. A practical embodiment has been found to be a displacement device wherein the tilting member is formed by a membrane oriented transverse to the first axis. The membrane biases the orientation of the gripper along the first axis, but allows the gripper to tilt from the first axis in an arbitrary direction. The membrane may serve as a resilient structure that exerts a first force upon the gripper in the first direction along the first axis. In this way the gripper is biased in a reference position relative to the holder.

In a preferred embodiment a position dependent tilt limiter limits the orientation of the gripper to a reference orientation when the gripper is in a reference position relative to the holder. In this way the gripper has a predetermined reference orientation, preferably aligned along the first axis, at least until the moment that it contacts the substrate. As soon as the gripper displaces relative to the holder along its first axis due to contact forces that come into existence when the gripper with the component touches the substrate the gripper is allowed to tilt. In this way the holder can make small lateral displacements without causing lateral displacements of the component or stress build-up in the gripper after the collision of the gripper with the component and the substrate where it is to be mounted or the surface where it is to be placed.

In an embodiment the displacement device includes a pretensioning structure for applying a pretension to the membrane in the first direction. In this way it is easier to tune the resulting force upon the gripper in the first direction, and the force with which the membrane resists against a deviation of the orientation of the gripper from the first axis. It is desired that the membrane allows for a guiding of the gripper along the z-axis. The membrane should additionally force the gripper in a reference orientation, (aligned with the z-axis) however, enable the gripper to tilt away from reference orientation with a minimal force. The additional pretensioning structure makes it possible to dimension these characteristics independently. E.g. the force biasing the gripper at its reference orientation may be minimised by reducing the thickness of the membrane and/or increasing its diameter. A force in axial direction may be exerted by the additional pretensioning structure. The pretension structure may include one or more springs e.g. spiral or leaf springs, from a metal for example. Alternatively air springs can be used or the structure can be constructed from elastic materials such as foam. The pretension structure need not be a resilient element. Any element capable of exerting an axial force on the gripper suffices. The position dependent tilt limiter preferably includes a stop piece on the gripper and a support structure on the holder, wherein the first resilient portion forces the stop piece to the support structure in an unloaded state of the gripper. In the unloaded state, the forced contact of the stop piece against the support structure restricts a tilt of the gripper. When the gripper is depressed upon contact of the gripper with the component on the substrate the restriction is gradually cancelled. In an implementation one or both of the stop piece and the support structure may comprise a resilient material, and therewith serve as a second resilient portion.

An assembly device according to the present invention comprises a placement device as described above and further comprises a displacement device for relatively displacing the placement device in a direction transverse to the first axis. The displacement device may cause relative displacement transverse to the first axis by displacing the substrate or by displacing the placement device, or by a combination of both.

BRIEF DESCRIPTION OF THE DRAWINGS

These and other aspects of the invention are described in more detail with reference to the drawing.
Therein:
FIG. 5A and 5B show a third embodiment of a placement device according to the invention in a first operational state and in a second operational state respectively.

DETAILED DESCRIPTION OF EMBODIMENTS

Figure 1:
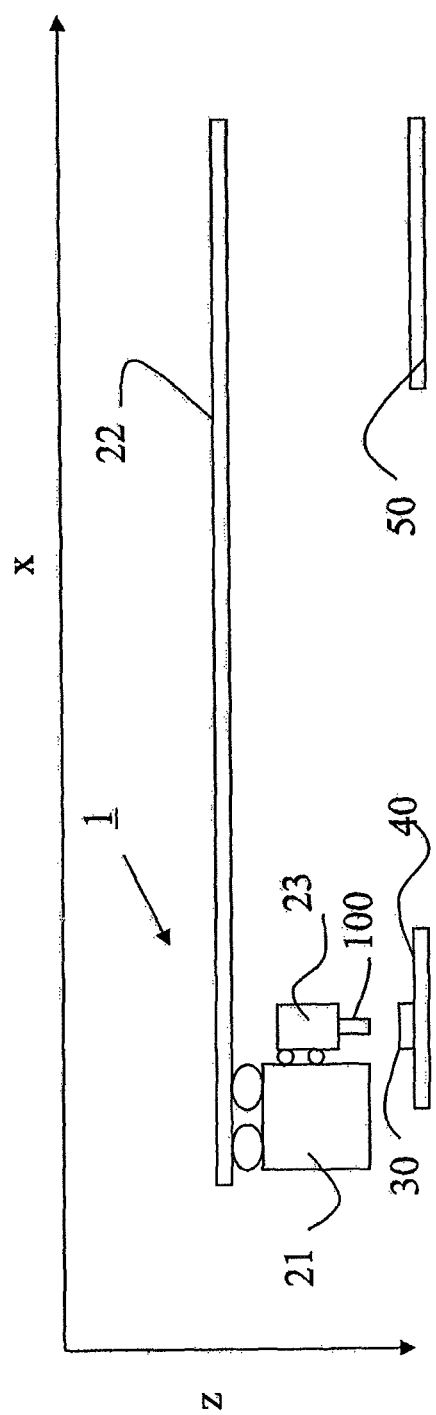
FIG. 1 schematically shows an assembly device 1,
FIG. 2 schematically shows the collision of a known gripper with a component to a substrate,
FIG. 3 schematically shows the collision of a gripper with a component to a substrate, in a first embodiment of the present invention.

FIG. 1 schematically shows an assembly device 1. The assembly device 1 comprises a placement device 100 and a displacement device for relatively displacing the placement device 100 a direction along a first axis (z) as well as a direction transverse to the first axis (x). The displacement device comprises a first sledge 21 that is moveable along the x-axis along a rail 22, and a second sledge 23 that is movable with relatively to the first sledge 21 in the z-direction. The placement device 100 is arranged to grip a component 30 from a conveyor belt 40 for example and after being displaced by the displacement device 21, 22, 23 mount this to a substrate, e.g. a printed circuit board 50.

Although in the embodiment shown the first sledge 21 moves the placement device in a direction orthogonal to the z-direction the movement direction of the sledge may be in a direction orientated at another non-zero angle with the z-axis. Alternatively the displacement device may be capable of displacing the placement device in a range of directions.

Figure 2:
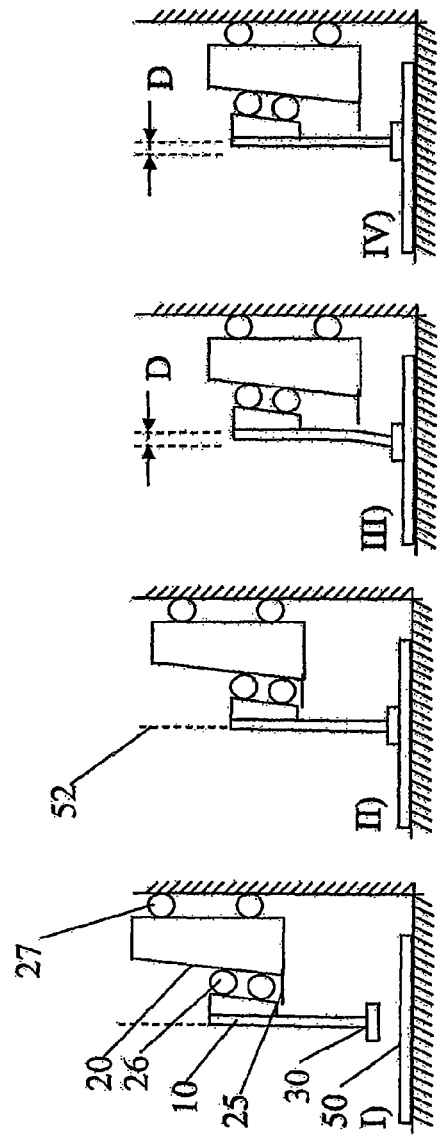

FIG. 2 schematically shows in four subsequent situations I-IV a collision of a gripper 10 with a component 30 against a substrate 50. The gripper 10 is movably coupled to a holder 20 via a guidance 26 and restricted by a support structure 25. In situation I the gripper 10 with component 30 approaches the substrate 50. In situation II the gripper 10 with the component 30 makes initial contact with the substrate. At this moment, when the gripper 10 stops its movement the component 30 is placed at a position indicated by reference line 52. As shown schematically in situation III during the movement of the gripper relative to the holder 20, the gripper may also incur a lateral displacement D for example because the relative movement of the gripper 10 is not fully aligned with the direction of movement of the holder 20, as shown here. Due to this lateral displacement, either a tension may be built up in the gripper 10 in case of a high friction between component and substrate as shown in situation III, or, as shown in situation IV the component may be displaced from the position where it was originally placed in case of a relatively low friction between component and substrate.

Figure 3:
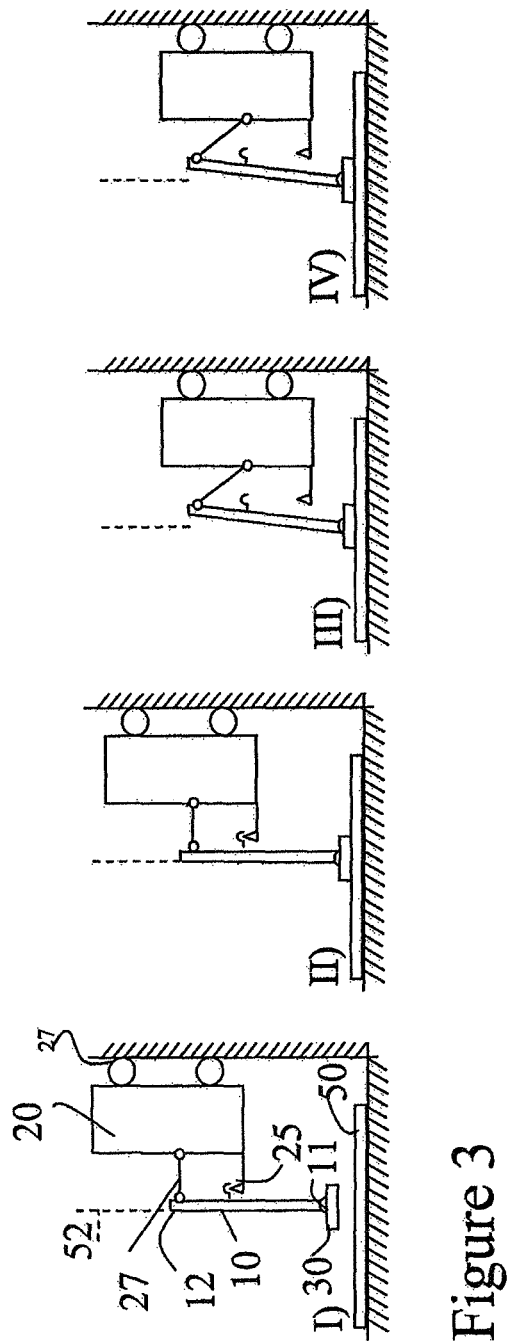

FIG. 3 schematically shows a first embodiment of a placement device according to the invention. Parts therein corresponding to those of FIG. 2 have the same reference numbers. In the embodiment of the invention shown in FIG. 3 the gripper 10 is coupled to the holder 20 by a tilting member 27.

Situations I and II in FIG. 3 are analogous to the situations I and II respectively, described with reference to FIG. 2. The gripper 10 is kept in a reference orientation by the support structure 25.

In situation III where the holder 20 has been further displaced, while the top 11 of the gripper 10 remained in the same position, the gripper 10 is released from its support structure 25, and the tilting member 27 allows the gripper to tilt. This tilting movement compensates for the lateral displacement D of the end 12 of the gripper 10. Accordingly, in situation III no tension is built up in the gripper 10 contrary to the situation III shown in FIG. 2 for the prior art placement device. Likewise in situation IV shown in FIG. 3 for the placement device according to the invention the component 30 is not laterally displaced after it is positioned. To facilitate a tilting movement between the gripper 10 and the component 30 the top 11 of the gripper may be made of a flexible material, e.g. of rubber.

Figure 4:
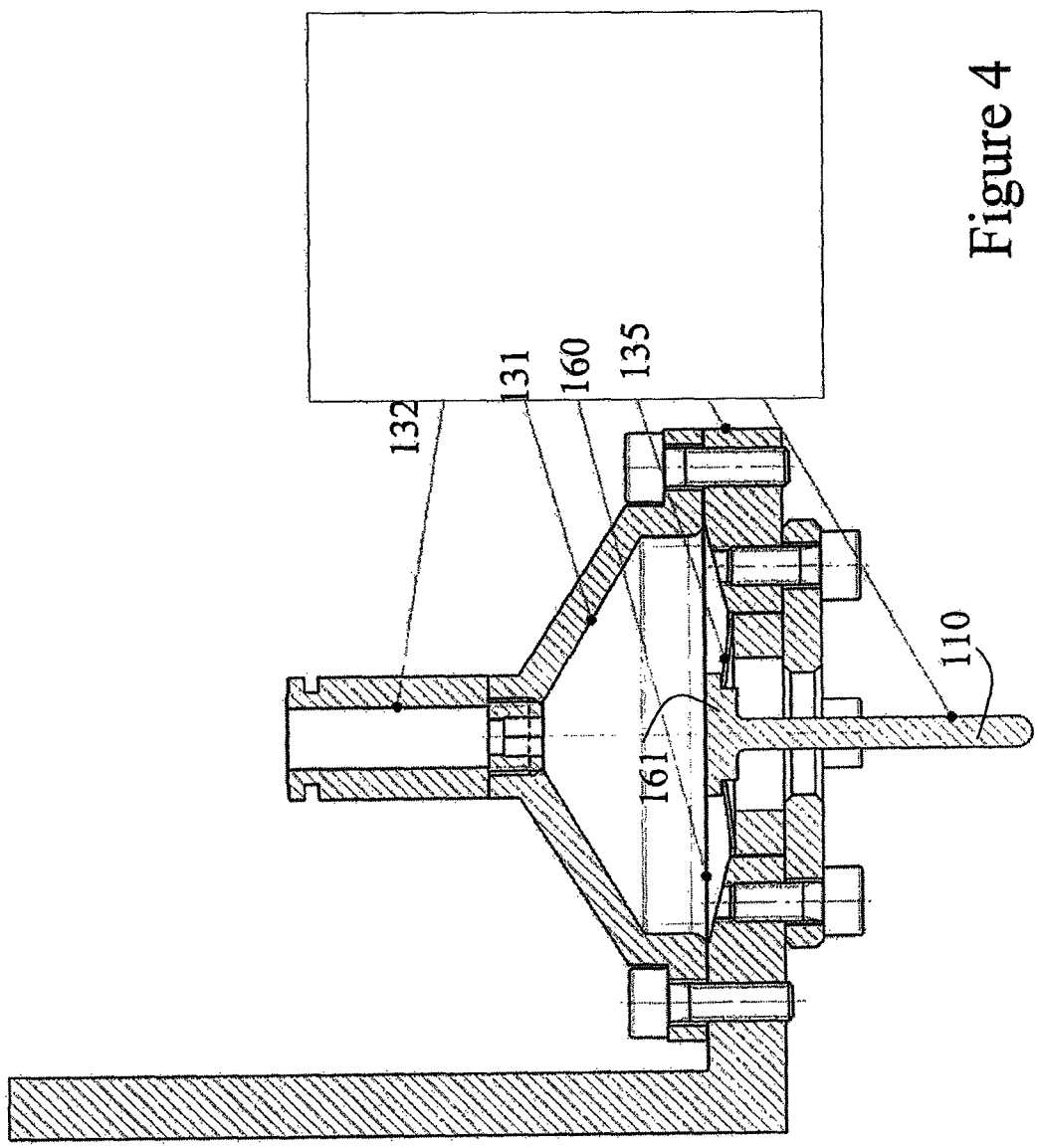
FIG. 4 shows a second embodiment of a placement device according to the invention,
FIG. 4A and 4B respectively show a first operational state and a second operational state of the second embodiment.

In FIG. 4, 4A, and 4B parts corresponding to those in FIG. 3 have a reference number that is 100 higher. FIG. 4 shows a second embodiment of the placement device according to the invention, drawn to scale in cross-section in FIG. 4, wherein the tilting member is formed by a membrane 160 oriented transverse to the first axis z. FIGS. 4A and 4B respectively show a first operational state and a second operational state of the second embodiment. The gripper 110 is mounted with a flange 161 to the membrane 160. A pretension is applied to the membrane by compressed air or an other medium in a pressure room 131 provided via a tube 132. In the embodiment shown the membrane 160, manufactured from RVS, had a diameter of 26 mm and thickness of 0.025 mm. An air pressure was applied in the range of 200 to 500 mbar above atmospheric pressure and preferably was 290 mbar, resulting in a pretension force of about 2.8 N on the membrane. The support structure 135 was performed by a cupped spring-washer having an outer diameter of 15 mm, an inner diameter of 6 mm and a stiffness of 492 N/mm. As shown also schematically in FIG. 4A, the flange 161 of the membrane 160 is biased against a support structure 135 on the holder. Accordingly in an unloaded state, the gripper 110 assumes a reference position relative to the holder. In this reference position its orientation is fixed along the z-axis. Accordingly the flange 161 and the support structure 135 cooperate to form a tilt limiter.

If the gripper 110 is depressed upon a collision with the substrate as shown in FIG. 4B, the flange 161 is displaced from the support structure 135 so that the flange 161 with the gripper 110 mounted thereon may be tilted relative to the holder 120. Accordingly, the tilt limiter formed by the flange 161 and the support structure 135 functions in a position dependent way.

In the embodiment shown the placement device includes a pretensioning structure 131 for applying a pretension to the membrane 160 in the first direction. In this example the pretensioning structure 131 is an air chamber. This has the advantage that the pretension on the membrane 160 can be adjusted by externally applying a controllable pressure of air or another gas. In another embodiment the pretensioning structure may be a metal spring, e.g. in a helical form. In still another embodiment the membrane may be of a sufficiently resilient material to be autonomously pretensioned against the support structure.

In a practical implementation the gripper is a vacuum gripper, which is the most commonly used type of gripper applied in micro-assembly. Other known gripper technologies may be applied however. The lower part (in the order of 5 mm) of the gripper cannot be much bigger then the component in order to be able to place the component close to other components, in particular if these are higher. The mass of the gripper is in general always much greater (in the order of a factor 10-1000) than the mass of the product that must be picked-up. By way of example a gripper is used in the form of a standard vacuum needle. The bottom part of the needle has a height of approximately 5 mm and a diameter of 0.5-2 mm. On top of the needle a vacuum supply is provided. The mass of the needle is in the order of 100 mg and on top of the gripper needle an additional mass is present from the membrane, flange and vacuum supply is in the order of 1 g.

FIG. 5A and 5B schematically show a third embodiment. Parts therein corresponding to those in FIG. 4A and 4B have a reference numeral that is 100 higher. In the embodiment shown therein the gripper 210 has a widened portion 261 that cooperates with a tapered hole 222 in a disc 221, for example of a resilient material. In the reference position of the gripper 210, shown in FIG. 5A, tilt thereof is limited by the cooperating widened portion 261 and tapered. hole 222. After depression of the gripper 210 (FIG. 5B) the more narrow part 212 of the gripper is allowed to move laterally within the hole 222

Figure 6:
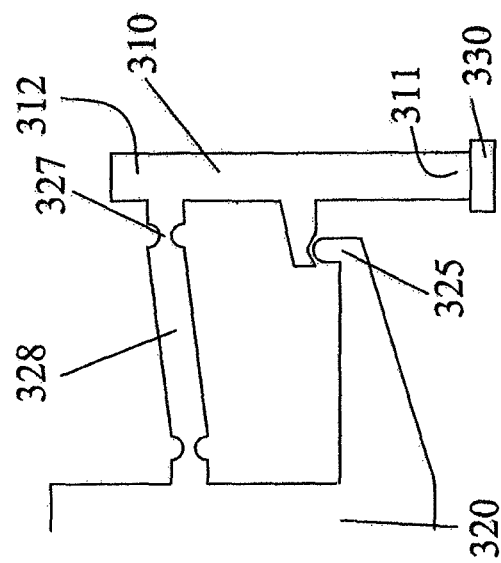
FIG. 6 shows a fourth embodiment of a placement device according to the invention.

FIG. 6 shows a fourth embodiment of a placement device according to the invention. Parts therein corresponding to those in FIG. 3 have a reference number that is 300 higher. In the embodiment shown therein the gripper 310 is coupled via a material hinge 327 to a leaf spring 328 which on its turn is coupled to the holder 320. The material hinge 327 is formed by a narrowed end-portion of the leaf spring 328. In an unloaded state the gripper 310 is forced into a reference position by support structure 325. When the holder 320 moves towards a surface where the component 330 is to be mounted the gripper 310 is decoupled from the support structure 325 once the motion of the gripper 310 with the component 330 towards the surface is stopped. Then the hinge 327 allows a tilting movement of the gripper 310 with reference to the holder 320. This tilting movement allows a lateral displacement of the end 312 of the gripper 310 while the tip 311 of the gripper 310 can maintain the position it had at the moment of collision without a build up of tension in the gripper 310.

What is claimed is:

1. A placement device comprising a vacuum gripper and a holder, wherein the vacuum gripper is movable relative to the holder along a first axis, characterized by a tilting member allowing the vacuum gripper to tilt away from the first axis, wherein the vacuum gripper and the holder are mutually coupled by the tilting member, and wherein the tilting member is formed by a membrane oriented transverse to the first axis and the vacuum gripper is formed as a vacuum needle.

2. A placement device according to claim 1, wherein a position dependent tilt limiter limits the orientation of the vacuum gripper to a reference orientation when the vacuum gripper is in a reference position relative to the holder.

3. A placement device according to claim 2, which includes a pretensioning structure for applying a pretension to the tilting member in the first direction.

4. An assembly device comprising a placement device according to claim 3 and further comprising a displacement device for relatively displacing the placement device in a direction transverse to the first axis.

5. A placement device according to claim 2, wherein the position dependent tilt limiter includes a stop piece on the vacuum gripper and a support structure on the holder, and wherein the pretensioning structure forces the stop piece to the support structure in an unloaded state of the vacuum gripper.

6. An assembly device comprising a placement device according to claim 5 and further comprising a displacement device for relatively displacing the placement device in a direction transverse to the first axis.

7. An assembly device comprising a placement device according to claim 2 and further comprising a displacement device for relatively displacing the placement device in a direction transverse to the first axis.

8. A placement device according to claim 1, which includes a pretensioning structure for applying a pretension to the tilting member in the first direction.

9. An assembly device comprising a placement device according to claim 8 and further comprising a displacement device for relatively displacing the placement device in a direction transverse to the first axis.

10. A placement device according to claim 1, wherein the vacuum gripper is coupled via a leaf spring to the holder and wherein the leaf spring has a narrowed end portion near the vacuum gripper that forms a tilting member.

11. An assembly device comprising a placement device according to claim 10 and further comprising a displacement device for relatively displacing the placement device in a direction transverse to the first axis.

12. An assembly device comprising a placement device according to claim 1 and further comprising a displacement device for relatively displacing the placement device in a direction transverse to the first axis.

* * * * *